United States Patent [19]

Matsumura et al.

[11] Patent Number: 4,809,029
[45] Date of Patent: Feb. 28, 1989

[54] GATE ARRAY LARGE SCALE INTEGRATED CIRCUIT DEVICE

[75] Inventors: Nobutake Matsumura; Shinji Sato, both of Yokohama, Japan

[73] Assignee: Fujitsu Limited, Kawasaki, Japan

[21] Appl. No.: 88,983

[22] Filed: Aug. 21, 1987

Related U.S. Application Data

[63] Continuation of Ser. No. 928,693, Nov. 7, 1986, abandoned, which is a continuation of Ser. No. 486,531, Apr. 19, 1983, abandoned.

[30] Foreign Application Priority Data

Apr. 23, 1982 [JP] Japan .................................. 57-67139

[51] Int. Cl.⁴ .............................................. G06F 13/00
[52] U.S. Cl. ...................................................... 364/900
[58] Field of Search ... 364/200 MS File, 900 MS File

[56] References Cited

U.S. PATENT DOCUMENTS

| | | | |
|---|---|---|---|
| 3,968,478 | 7/1976 | Mensch | 364/491 |
| 4,040,035 | 8/1977 | Bennett et al. | 364/200 |
| 4,086,626 | 4/1978 | Chung | 364/200 |
| 4,106,090 | 8/1978 | Erickson et al. | 364/200 |
| 4,484,292 | 11/1984 | Hong | 364/491 |

*Primary Examiner*—David Y. Eng
*Attorney, Agent, or Firm*—Staas & Halsey

[57] ABSTRACT

A gate array LSI includes a basic cell array region on which internal cell arrays are arranged, and a peripheral circuit region, arranged on the periphery of the basic cell array region. The peripheral circuit region includes input/output cell regions, for constructing an input buffer circuit and part of an output buffer circuit, and a general purpose cell array region, for constructing the remaining part of the output buffer circuit. When the output buffer circuit is not constructed, the general purpose cell array region is used for constructing various other desired circuits.

13 Claims, 10 Drawing Sheets

GATE ARRAY LARGE SCALE INTEGRATED CIRCUIT DEVICE

This is a continuation of U.S. Application Ser. No. 928,693, filed Nov. 7, 1986, now abandoned, which is a continuation of U.S. Application Ser. No. 486,531, filed Apr. 19, 1983, now abandoned.

BACKGROUND OF THE INVENTION

(1) Field of the Invention

The present invention relates to a complementary metal oxide semiconductor (CMOS) gate array large scale integrated circuit (LSI) device, more particularly, to a gate array LSI in which various functions, such as an internal test circuit, can be realized by providing, on part of peripheral circuit regions on an LSI chip, a general-purpose cell array regions.

(2) Description of the Prior Art

CMOS gate array LSI's made by the master slice method have undergone continued development due to increasingly diverse LSI designer requirements and the strong need for easier LSI inspection.

A conventional CMOS gate array LSI comprises an internal cell array region for internal circuits, in which a plurality of CMOS basic cells including N channel MOS transistors and P channel MOS transistors having common gates, are arranged, and peripheral circuit regions, in which input buffer circuits, output buffer circuits, protective circuits, input/output pads, and so forth are arranged. The basic cells in the cell array region for the internal circuits can be appropriately wired for effective use as inverters, NAND gates, NOR gates, flip-flops, and so forth.

A problem arises, however, in that the transistors in the peripheral circuit regions are laid out in such a manner that only limited circuits, such as input buffer circuits, output buffer circuits, and bi-directional buffer circuits, can be realized. Other circuits, for example, Schmitt trigger circuits and clock gate circuits, cannot be formed in the peripheral circuit regions.

Shift registers also cannot be formed in the peripheral circuit regions. Since a test circuit requires shift registers, a circuit for testing circuits formed in the internal cell array region cannot be formed in the peripheral circuit regions. Formation of a test circuit in the internal cell array region itself would use up part of the internal cell array region and, thus, prevent effective utilization of the region.

Another problem is that the number of transistors forming the input buffer circuit on the peripheral circuit regions is smaller than the number of transistors forming the output buffer circuit or the bi-directional buffer circuit, i.e., the input/output buffer circuit. Also, the transistors in the peripheral circuit regions are regularly arranged with the same pattern. Therefore, there are excessive transistors in the region where the input buffer circuit is formed, that is, where a bi-directional buffer circuit is not formed. The extra transistors are not used for other applications and, thus, are useless. It should be noted that, regardless of the utilization of the peripheral circuit regions, the area of the regions cannot be reduced because a power supply line and ground line must be extended onto the regions.

SUMMARY OF THE INVENTION

A primary object of the present invention is to provide a gate array LSI having general purpose cell array regions on part of the peripheral circuit regions so as to enable tests of the circuits on the internal cell array region.

Another object of the present invention is to provide a gate array LSI as mentioned above, wherein a Schmitt trigger circuit, clock gate circuit, and other circuits can be formed on the peripheral circuit regions in accordance with requirements of LSI designers.

The above objects of the present invention are achieved by using a gate array LSI comprising a basic cell array region on which a plurality of basic cells, and a peripheral circuit region arranged on the periphery of the basic cell array region. On the peripheral circuit region there is arranged an input/output cell array, having a plurality of input/output cells, and a general purpose cell array having a plurality of general purpose cells.

Each of the input/output cells comprise a first group of elements, for constructing a part of an output buffer circuit, and second group of elements, for constructing an input buffer circuit. Each of the general purpose cells comprises a plurality of general purpose transistors for constructing at least the remaining part of the output buffer circuit. The plurality of general purpose transistors are arranged on the general purpose cell array regions so as to enable construction of desired logic circuit when the output buffer circuit is not constructed.

The above object and other objects as well as the characteristic features of the invention will become more apparent and readily understandable by the following description in conjunction with the accompanying drawings.

DESCRIPTION OF THE PREFERRED EMBODIMENTS

Figure 1:
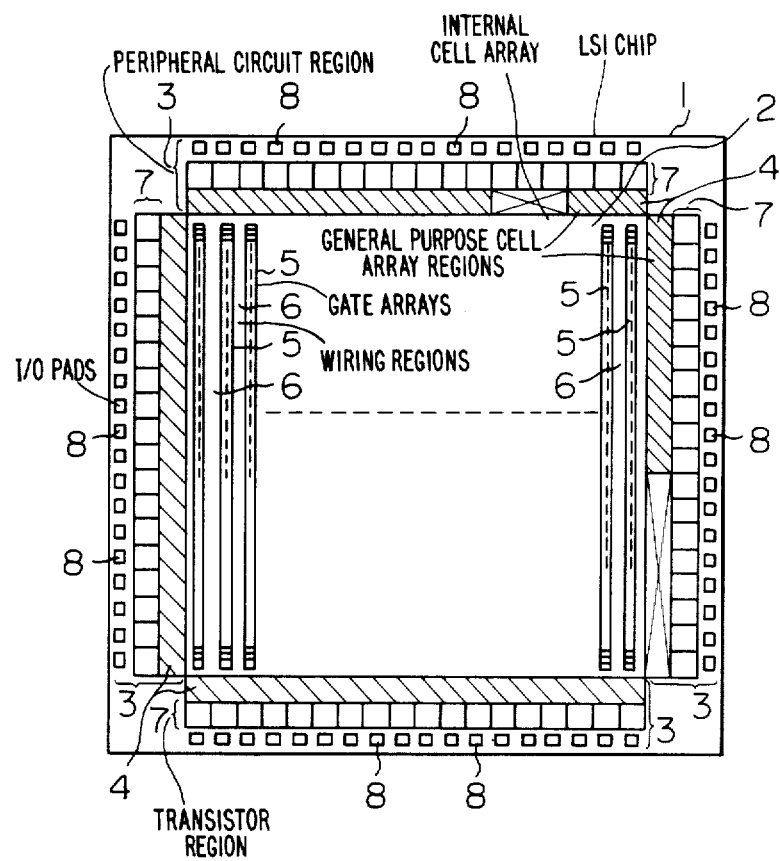
FIG. 1 is a general plan view of a pattern of a CMOS gate array LSI according to an embodiment of the present invention.

Embodiments of the present invention will now be described with reference to the drawings. The same reference numerals and notations in the drawings represent the same parts.

FIG. 1 is a general plan view of a pattern of a CMOS gate array LSI according to an embodiment of the present invention. In FIG. 1, on the central portion of an LSI chip 1, there is an internal cell array region 2. On the peripheral portion, there are peripheral circuit regions 3. According to the present invention, general purpose cell array regions 4 are provided on part of the peripheral circuit regions 3 adjacent to the internal cell array region 2.

On the internal cell array region 2, CMOS gate arrays 5 are regularly arranged with wiring regions 6 therebetween.

The peripheral circuit regions 3 comprise transistor regions 7 provided with transistors for constructing interface circuits, such as input buffer circuits, output buffer circuits, and bi-directional buffer circuits, between the internal cell array region and the external circuits of the LSI. The peripheral circuit regions 3 also comprise a region on which input/output pads 8 are arranged.

On the general purpose cell array regions 4 provided according to the present invention, MOS transistors are arranged in arrays. In the figure, the transistor regions 7 adjacent to portions of the general purpose cell array regions 4, illustrated by slash lines, are where input buffer circuits which require a relatively small number of transistors are constructed. Therefore, any circuit, such as a Schmitt trigger circuit or clock gate circuit, may be constructed on the slashed portions independently from the circuits on the transistor regions 7, in accordance with the requirements of LSI designers.

The transistors on the portions other than the slashed portions in the general purpose cell array regions 4 and the transistors in the transistor regions 7 adjacent to these other portions, construct output buffer circuits or bi-directional buffer circuits.

Figure 2:
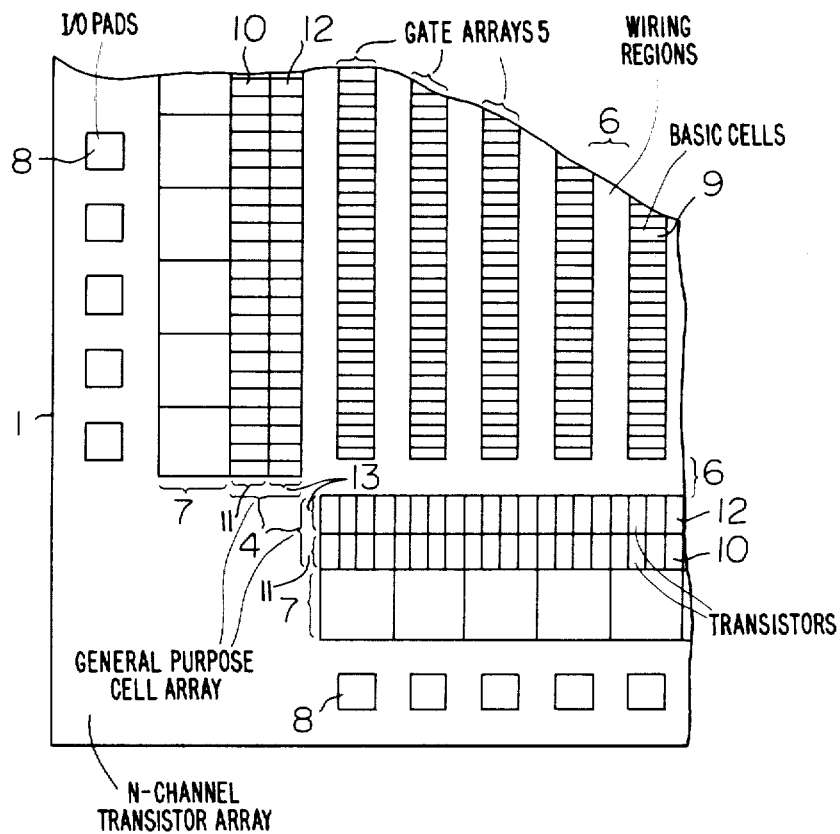
FIG. 2 is an expanded view of a part of the pattern of FIG. 1.

FIG. 2 is an expanded pattern view of a part of FIG. 1. In FIG. 2, each of the CMOS gate arrays 5 comprises a number of basic cells 9. Using these basic cells 9, any desired logic circuit can be formed by a master slice method. Also, on each of the general purpose cell array regions 4, one row of an N channel transistor array 11 comprising a number of N channel MOS transistors 10 and another row of a P channel transistor array 13 comprising a number of P channel MOS transistors 12 are arranged.

Figure 3:
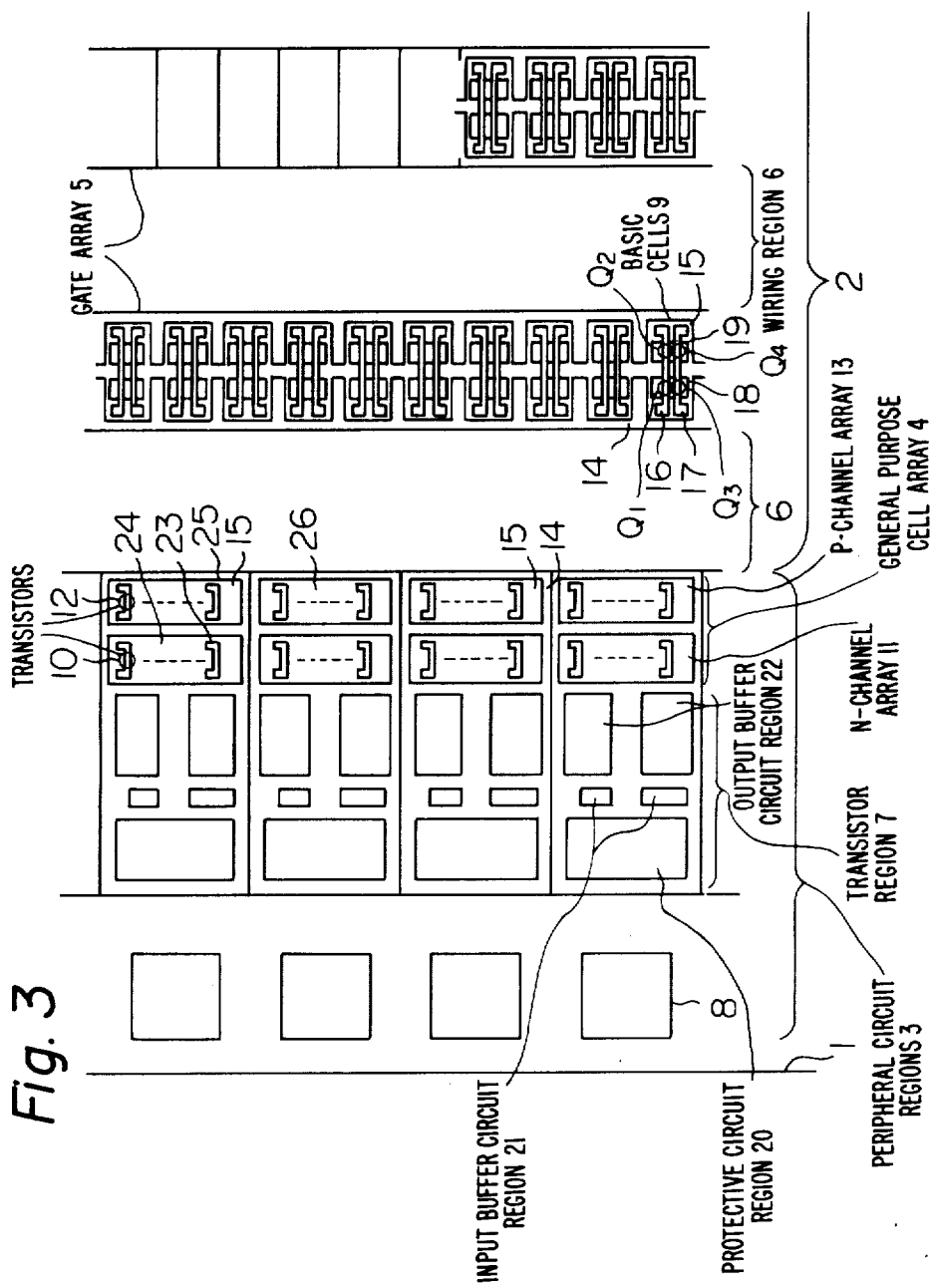
FIG. 3 is a detailed, expanded view of a part of the pattern of FIG. 2.

FIG. 3 is a detailed, expanded pattern view of a part of FIG. 2. In FIG. 3, the basic cells 9 included in each CMOS gate array 5 in the internal cell array region 2 are electrically isolated from each other by isolation regions 14. Each basic cell 9 comprises two gate electrodes 16 and 17, formed on a semiconductor substrate 15 through an insulating layer (not shown), and a P-type diffusion layer 18 and an N-type diffusion layer 19, formed near the surface of the semiconductor substrate 15, by utilizing the gate electrodes as masks. The gate electrode 16 and the P-type diffusion layer 18 form a P channel MOS transistor $Q_1$; the gate electrode 16 and the N-type diffusion layer 19 form an N channel MOS transistor $Q_2$; the gate electrode 17 and the P-type diffusion layer 18 form a P channel MOS transistor $Q_3$; and the gate electrode 17 and the N-type diffusion layer 19 form an N channel MOS transistor $Q_4$. The P channel MOS transistor $Q_1$ and the N channel MOS transistor $Q_2$ commonly have the gate electrode 16. The P channel MOS transistor $Q_3$ and the N channel MOS transistor $Q_4$ commonly have the gate electrode 17.

On the transistor regions 7 in the peripheral circuit regions 3, there is provided a protective circuit region 20, an input buffer circuit region 21, and an output buffer circuit region 22, corresponding to each input-/output pad 8.

On the general purpose cell array regions 4 provided according to the present invention, there is arranged one N channel transistor array 11 and one P channel transistor array 13, corresponding to each input/output pad 8. Each N channel transistor array 11 comprises a number of N channel transistors 10 which are constructed by a number of gate electrodes 23, and an N-type diffusion layer 24 formed near the surface of the semiconductor substrate 15 by utilizing the gate electrodes 23 as masks. Similarly, each P channel transistor array 13 comprises a number of P channel MOS transistors 12 which are constructed by gate electrodes 25 and a P-type diffusion layer 26.

Figure 4:
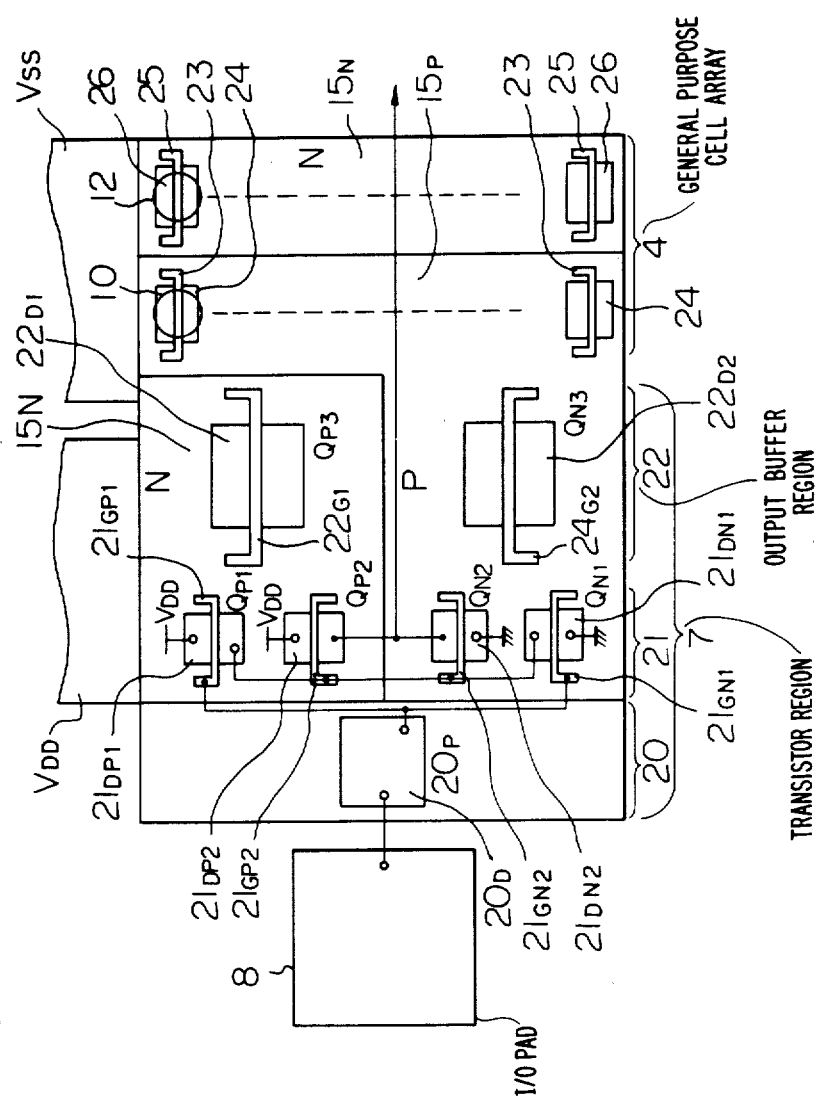
FIG. 4 is a detailed, expanded view of a part of the pattern of FIG. 3.

FIG. 4 is a detailed, expanded view of a part of the pattern of FIG. 3. In FIG. 4, one input/output pad 8, a part of the transistor regions 7 corresponding to the input/output pad 8, and a part of the general purpose cell array region 4 corresponding to the input/output pad 8 are illustrated. On the part of the general purpose cell array region 4, each of the N channel MOS transistors 10 is formed on the semiconductor substrate $15_P$, which is a P-type well formed at the surface of the N-type semiconductor substrate $15_N$. At the surface of the P-type well $15_P$, N-type diffusion layers 24 are formed by using the gate electrodes 23 as masks. Also, each P channel MOS transistor 12 is formed on the N-type semiconductor substrate $15_N$ by the P-type diffusion layer 26 and the gate electrode 25.

On the part of the protective circuit region 20, a diffusion region $20_D$ is formed so as to form a protective circuit $20_P$ including resistors and diodes. On the part of the input buffer circuit region 21, two P channel MOS transistors $Q_{P1}$ and $Q_{P2}$ are formed on the N-type semiconductor substrate $15_N$; and two N channel MOS transistors $Q_{N1}$ and $Q_{N2}$ are formed on the P-type well $15_P$. Each of these transistors $Q_{P1}$, $Q_{P2}$, $Q_{N1}$ and $Q_{N2}$ has a diffusion layer $21_{DP1}$, $21_{DP2}$, $21_{DN1}$ or $21_{DN2}$, respectively, and a gate electrode $21_{GP1}$ $21_{GP2}$, $21_{GN1}$, or $21_{GN2}$, respectively.

On the part of the output buffer circuit region 22, a P channel MOS transistor $Q_{P3}$ and an N channel MOS transistor $Q_{N3}$ are formed on the N-type semiconductor substrate $15_N$ and on the P-type well $15_P$, respectively. The transistor $Q_{P3}$ has a diffusion layer $22_{D1}$ and a gate electrode $22_{G1}$; and the transistor $Q_{N3}$ has a diffusion layer $22_{D2}$ and a gate electrode $22_{G2}$. The gate electrodes of the transistors $Q_{P3}$ and $Q_{N3}$ are larger in size than those of the other transistors.

The transistors $Q_{P1}$, $Q_{P2}$, $Q_{N1}$, $Q_{N2}$, $Q_{P3}$ and $Q_{N3}$, are covered by a power supply line $V_{DD}$ through an insulating layer (not shown). The transistors $Q_{10}$ and $Q_{12}$ on the general purpose cell array region 4 are covered by a ground line $V_{SS}$ through an insulating layer (not shown).

When the illustrated part of the transistor regions 7 is utilized to form an input buffer circuit, only the transistors $Q_{P1}$, $Q_{P2}$, $Q_{N1}$, and $Q_{N2}$ and the protective circuit region 20 are used. In this case, the transistors on the output buffer circuit region 22 and the general-purpose cell array region 4 are not used to form the input buffer circuit. To form the input buffer circuit, wiring as illustrated in FIG. 4 is carried out by utilizing a first wiring layer. The power supply line $V_{DD}$ and the ground line $V_{SS}$ are formed by a second wiring layer formed on the first insulating layer through an insulating layer. The utility of the transistor regions 7 is not restricted to form the input buffer circuit, various circuits can be formed on the transistor regions 7.

Figure 5:
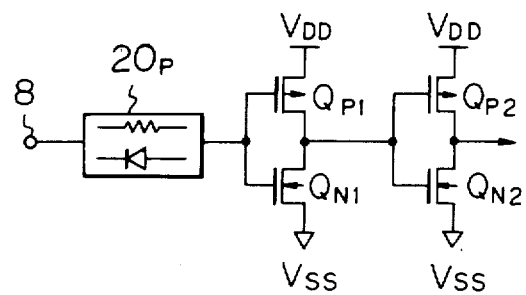
FIG. 5 is a circuit diagram of an input buffer circuit realized by the pattern of FIG. 4.

FIG. 5 is an equivalent circuit diagram of the input buffer circuit realized by the wiring illustrated in FIG. 4. Referring to FIGS. 4 and 5, the gate electrodes of the P channel MOS transistor $Q_{P1}$ and the N channel MOS transistor $Q_{N1}$ are commonly connected through the protective circuit $20_P$ to the input/output pad 8. With respect to the gate electrode $21_{GP1}$ of the transistor $Q_{P1}$, one side of the diffusion region $21_{DP1}$ is connected to the power supply line $V_{DD}$. The other side is connected commonly to the gate electrodes $21_{GP2}$ and $21_{GN2}$ of the transistors $Q_{P2}$ and $Q_{N2}$ and to one side of the diffusion region $21_{DN1}$ of the transistor $Q_{N1}$. With respect to the gate electrode $21_{GP2}$ of the transistor $Q_{P2}$, one side of the diffusion region $21_{DP2}$ is connected to the power supply line $V_{DD}$. The other side of the diffusion region $21_{DP2}$ is connected to one side of the diffusion region $21_{DN2}$ of the transistor $Q_{N2}$. The commonly connected point of the diffusion regions of the transistors $Q_{P2}$ and $Q_{N2}$ is connected to an internal circuit (not shown in FIGS. 4 and 5).

Since the transistors on the output buffer circuit region 22 and on the general purpose cell array region 4 are not used when the input buffer circuit is formed, these transistors can be used to form test circuits, a Schmitt trigger circuit, a clock gate circuit, and so forth.

Figure 6:
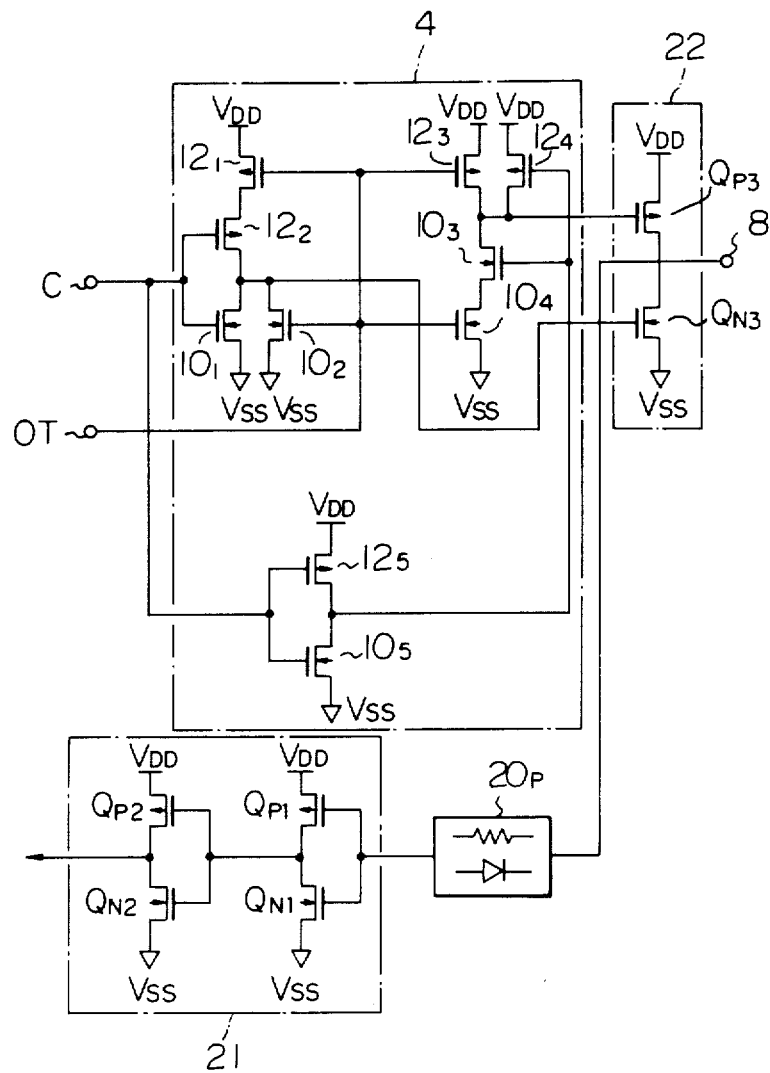
FIG. 6 is a circuit diagram of a bi-directional buffer circuit realized by the pattern of FIG. 4.

By using the transistors on the general purpose cell array region 4, the input buffer circuit region 21, and the output buffer circuit region 22, a bi-directional buffer circuit can also be formed. FIG. 6 is an equivalent circuit diagram of a bi-directional buffer circuit. In FIG. 6, five N channel MOS transistors $10_1$ through $10_5$ and five P channel MOS transistors $12_1$ through $12_5$ on the general purpose cell array region 4, the P channel MOS output transistor $Q_{P3}$ and the N channel MOS output transistor $Q_{N3}$ on the output buffer circuit region 22, the two P channel MOS transistors $Q_{P1}$ and $Q_{P2}$ and the two N channel MOS transistors $Q_{N1}$ and $Q_{N2}$ on the input buffer circuit region 21, and the protective circuit $20_P$ formed on the protective circuit region 20 are used to form the bi-directional buffer circuit.

The operation of the bi-directional buffer circuit of FIG. 6 is well known. Briefly, when a control signal applied to a control terminal C is at a high level (H), both of the output transistors $Q_{P3}$ and $Q_{N3}$ are turned off so that the input/output pad 8 becomes a high impedance state. In this state, no output data applied from the internal circuits to an output data terminal OT can be obtained at the input/output pad 8. Instead, input data applied to the input/output pad 8 can be supplied through the protective circuit $20_P$ and the input buffer circuit on the region 21 to the internal circuits. In contrast, when the control signal applied to the control terminal C is at a low level (L), the output data from the internal circuits can be transferred through the circuit on the general purpose cell array region 4 and through the output buffer circuit on the region 22 to the input/output pad 8.

Figure 7:
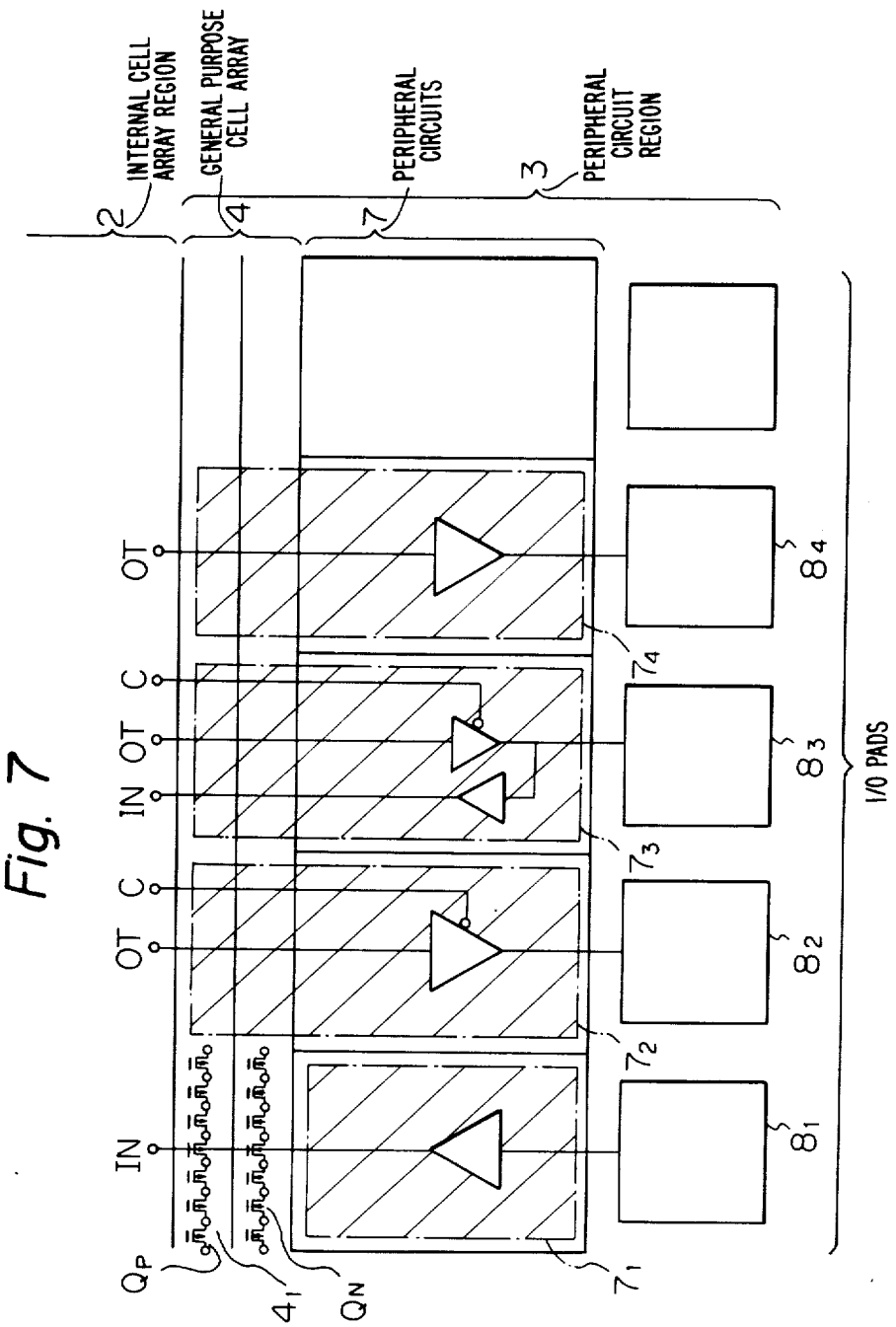
FIG. 7 is a block circuit diagram of an example of a part of the peripheral circuit region and the general purpose cell array region in FIG. 3.

FIG. 7 is a block circuit diagram of an example of part of the circuits in the peripheral circuit region 3 and the general purpose cell array region 4. In FIG. 7, a peripheral circuit $7_1$ connected to an input/output pad $8_1$ is an input buffer circuit. The output of the input buffer circuit $7_1$ is connected to an input end IN of a basic cell array arranged on the internal cell array region 2. A peripheral circuit $7_2$, connected to an input/output pad $8_2$, is a three-state output buffer circuit, the input of which is connected to an output data terminal OT of the basic cell array, and the control terminal of which is connected to a control terminal C of the basic cell array. A peripheral circuit $7_3$ connected to an input/output pad $8_3$ is a three-state bi-directional buffer circuit, the output, the input, and the control terminal of which are connected to an input data terminal IN, an output data terminal OT, and a control terminal C of the basic cell array, respectively. A peripheral circuit $7_4$ connected to an input/output pad $8_4$ is an output buffer circuit, the input of which is connected to an output data terminal OT of the basic cell array.

The number of transistors forming the input buffer circuit $7_1$ can be smaller than the number of transistors forming the three-state output buffer circuit $7_2$, three-state bi-directional buffer circuit $7_3$, or output buffer circuit $7_4$. Because of this, the general purpose cell array region $4_1$ adjacent to the input buffer circuit $7_1$ can be used for any purpose desired by an LSI designer. On the other hand, the general purpose cell array adjacent to the three-state output buffer circuit $7_2$, three-state bi-directional buffer circuit $7_3$, or output buffer circuit $7_4$ is used as part of the transistors forming the respective circuits. In the figure, on the general purpose cell array region corresponding to one input/ output pad, there are, for example, seven N channel MOS transistors $Q_N$ connected in series and seven P channel MOS transistors $Q_P$ connected in series. Normally, because a plurality of input buffer circuits $7_1$ are often provided continuously, the number of transistors which are not used for constructing the peripheral circuits becomes very large. For example, when two input buffer circuits are arranged continuously, 14 N channel MOS transistors and 14 P channel MOS transistors in the general purpose cell array region can be used as general purpose cells. When three input buffer circuits are arranged continuously, 21 N channel MOS transistors and 21 P channel MOS transistors can be used as general purpose cells. Thus, as illustrated by the slash lines in FIG. 1, a number of transistors can be used as general purpose cells.

In a conventional peripheral circuit region, the peripheral circuit region 3 and the region corresponding to the general purpose cell array region 4 in the present invention are combined. Transistors necessary for constructing the peripheral circuit are arranged thereon. Since no general purpose cell array region is included, the transistors in the portion of the input buffer circuits are not used and, thus, are wasted.

Further, conventionally, the power supply line $V_{CC}$ and ground line $V_{SS}$ are, of course, necessary. These lines have considerably wide widths, as in the present invention shown in FIG. 4. On the other hand, the conventional peripheral circuit region is not as large as the peripheral circuit region 3 and the general purpose cell array region 4 according to the present invention, because the conventional peripheral circuit region has no general purpose cell array region. Therefore, the part of the conventional peripheral circuit region on which the power supply line and ground line are formed, includes no transistors or wirings. Thus, the above-mentioned part of the conventional peripheral circuit region is useless.

Figure 8:
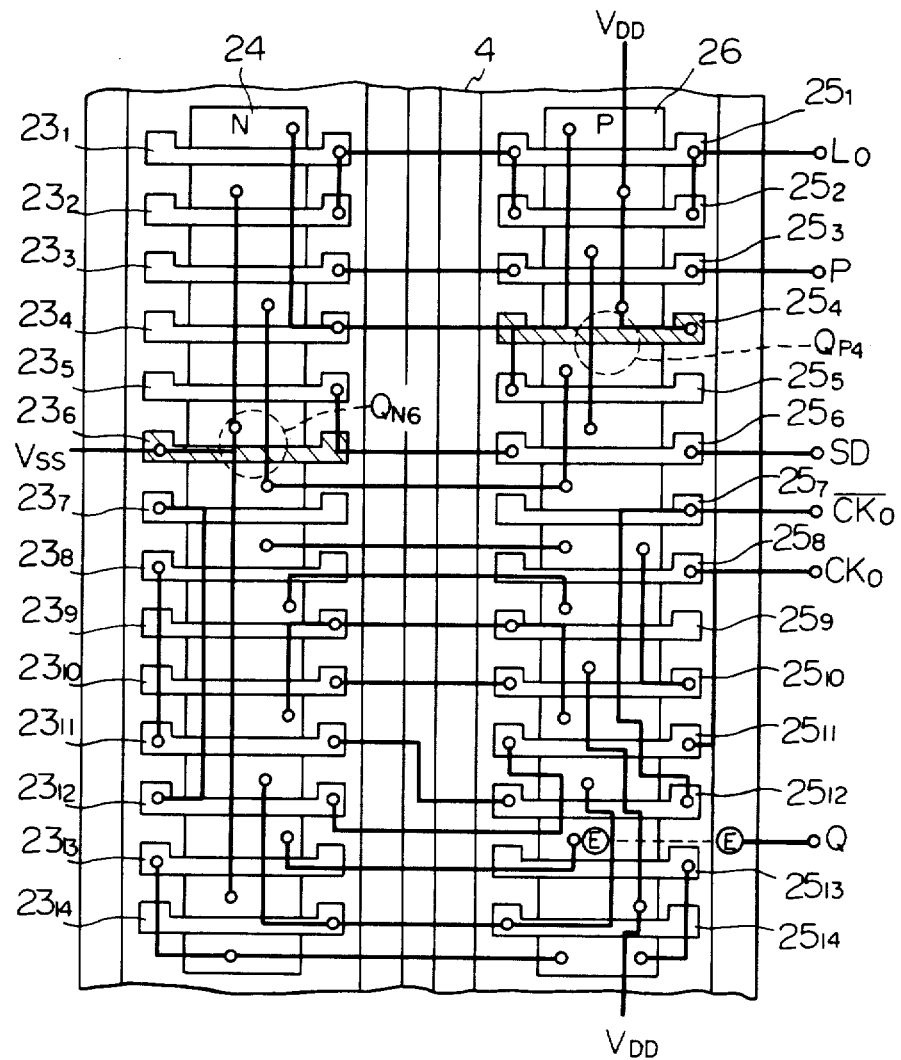
FIG. 8 is an expanded view of a one-bit shift register as an example of a wiring pattern in the general purpose cell array region in FIGS. 1 through 3.

FIG. 8 is an expanded pattern view of a one-bit shift register as an example of a wiring pattern in the general purpose cell array region 4 of FIGS. 1 through 3. In FIG. 8, 14 N channel MOS transistors, formed in series by gate electrodes $23_1$ through $23_{14}$ and an N-type diffusion region 24, and P channel MOS transistors, formed in series by gate electrodes $25_1$ through $25_{14}$ and a P-type diffusion region 26, are illustrated.

The gate electrode $23_6$ is connected to the ground line $V_{SS}$, whereby the N channel MOS transistor $Q_{N6}$ for the gate electrode $23_6$ is in a normally off state. Similarly, the gate electrode $25_4$ is connected to the power supply line $V_{DD}$, whereby the P channel MOS transistor $Q_{P4}$ for the gate electrode $25_4$ is in a normally off state. By setting the transistor $Q_{P4}$ in the normally off state, the circuits on both sides of the transistors $Q_{P4}$ are electrically isolated from each other. Similarly, by setting the gate potential of the transistor $Q_{N6}$ to ground potential (also referred to as $V_{SS}$), the transistor $Q_{N6}$ becomes normally off so that the circuits on both sides of the transistor $Q_{N6}$ are electrically isolated from each other.

Conventionally, in order to electrically isolate circuits adjacent to each other, an isolation region made of insulating material is provided. The isolation region, however, decreases the integration degree.

In contrast, according to the present invention, by setting the desired transistors on the general purpose cell array region to the normally off state, electrical isolation of the adjacent circuits can easily be effected without decreasing the integration degree.

By appropriately wiring each gate electrode and each diffusion region which is the source or the drain of the transistor, a shift register is constructed. An equivalent circuit of the shift register is illustrated in FIG. 9.

Figure 9:
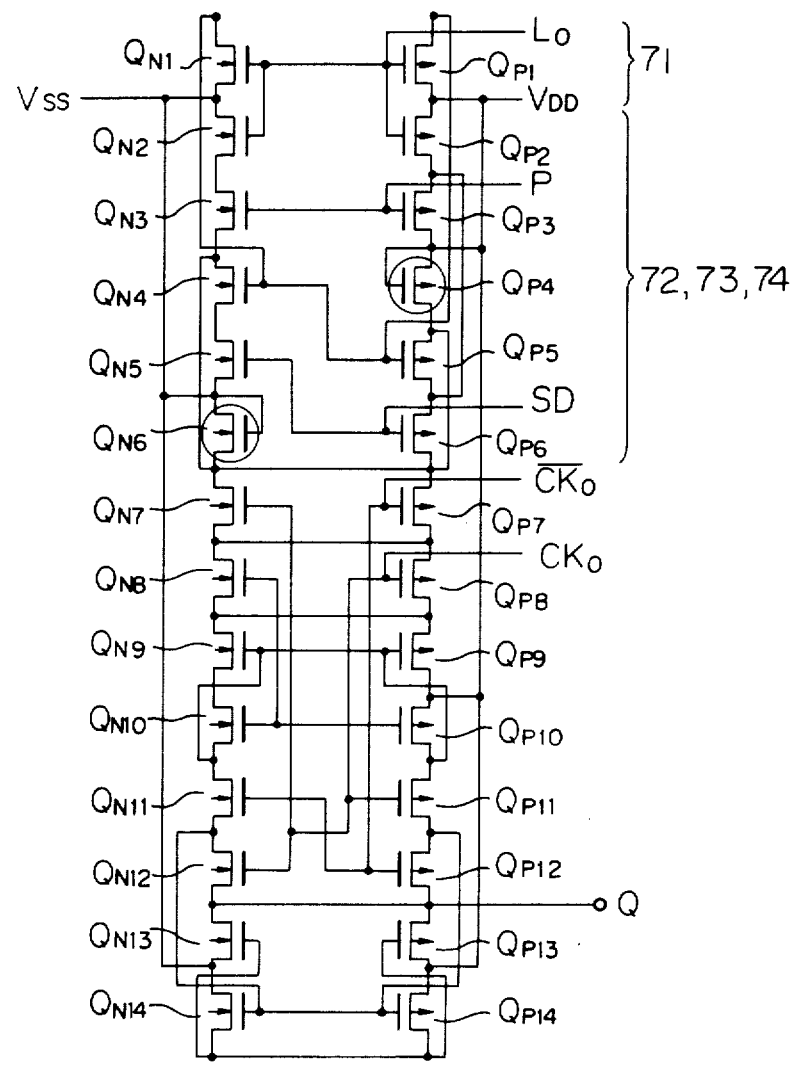
FIG. 9 is an equivalent circuit diagram of the shift register of FIG. 8.

In FIG. 9, the circled N channel MOS transistor $Q_{N6}$ and the P channel MOS transistor $Q_{P4}$ are isolating transistors which are normally off. A signal $L_0$ commonly supplied to the gates of the transistors $Q_{N1}$, $Q_{N2}$, $Q_{P1}$ and $Q_{P2}$ is a load signal for determining which data should be loaded among a common data P or data SD. The common data P is commonly supplied to the gates of the transistors $Q_{N3}$ and $Q_{P3}$. The data SD is commonly supplied to the gates of the transistors $Q_{N5}$ and $Q_{P6}$. $CK_0$ and $\overline{CK_0}$ are clock signals. The clock signal $CK_0$ is commonly supplied to the gates of $Q_{P8}$, $Q_{P11}$, $Q_{N7}$, and $Q_{N12}$. The inverted clock signal $\overline{CK_0}$ is commonly supplied to the gates of $Q_{P7}$, $Q_{N8}$, $Q_{P12}$ and $Q_{N11}$. Reference symbol Q is an output signal from the common connecting point of the source of $Q_{N12}$ and the drain of $Q_{P12}$.

Figure 10:
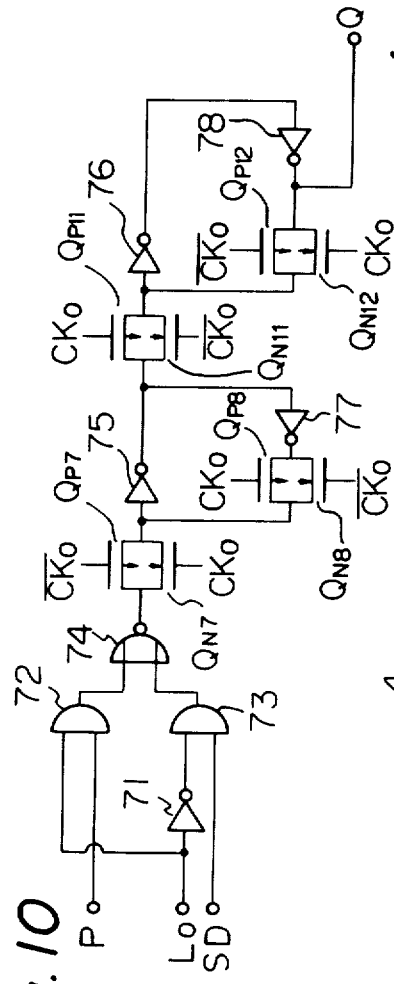
FIG. 10 is a further simplified equivalent circuit diagram of FIG. 9.

FIG. 10 is a further simplified equivalent circuit diagram of FIG. 9. In FIGS. 9 and 10, the transistors $Q_{N1}$ and $Q_{P1}$ comprise a CMOS inverter 71. An AND gate 72, AND gate 73, and NOR gate 74 are constructed by the transistors $Q_{N2}$, $Q_{N3}$, $Q_{N4}$, $Q_{N5}$, $Q_{p2}$, $Q_{p3}$, $Q_{p5}$ and $Q_{P6}$. The clock signal $\overline{CK_0}$ is applied to the gates of the transistors $Q_{N7}$, $Q_{P8}$, $Q_{P11}$ and $Q_{N12}$. The inverted clock signal $CK_0$ is applied to the transistors $Q_{P7}$, $Q_{N8}$, $Q_{N11}$ and $Q_{P12}$. The transistors $Q_{N9}$ and $Q_{P9}$ comprise an inverter 75, the transistors $Q_{N10}$ and $Q_{P10}$ comprised an inverter 76; the transistors $Q_{N13}$ and $Q_{P13}$ comprise an inverter 77; and the transistors $Q_{N14}$ and $Q_{P14}$ comprise an inverter 78.

The operation of the shift register of FIG. 10 will now be briefly explained.

When the value of the load signal $L_0$ is "1", i.e., a high level, the common data P is input through the AND gate 73 to the NOR gate 74. The data input to the NOR gate 74 is output as an output signal Q, through the transistor $Q_{P7}$ or $Q_{N7}$, the inverter 75, the transistor $Q_{P11}$ or $Q_{N11}$, and the inverter 78, bit by bit, in response to the clock signal $CK_0$ and its the inverted signal $\overline{CK_0}$. A positive feedback loop comprising of the inverter 77 and the transistors $Q_{P8}$ and $Q_{N8}$ stabilizes input data to the inverter 75. Similarly, a positive feedback loop comprising an inverter 77 and transistors $Q_{P8}$ and $Q_{N8}$ stabilize input data to the inverter 76.

In FIGS. 8 through 10, only a single one-bit shift register is illustrated. In practice, however, it is possible to construct a number of one-bit shift registers shown in FIG. 5 in the general purpose cell array region 4, so that a test circuit able to test all of the internal basic cells can be formed in the general purpose cell array region 4.

Figure 11:
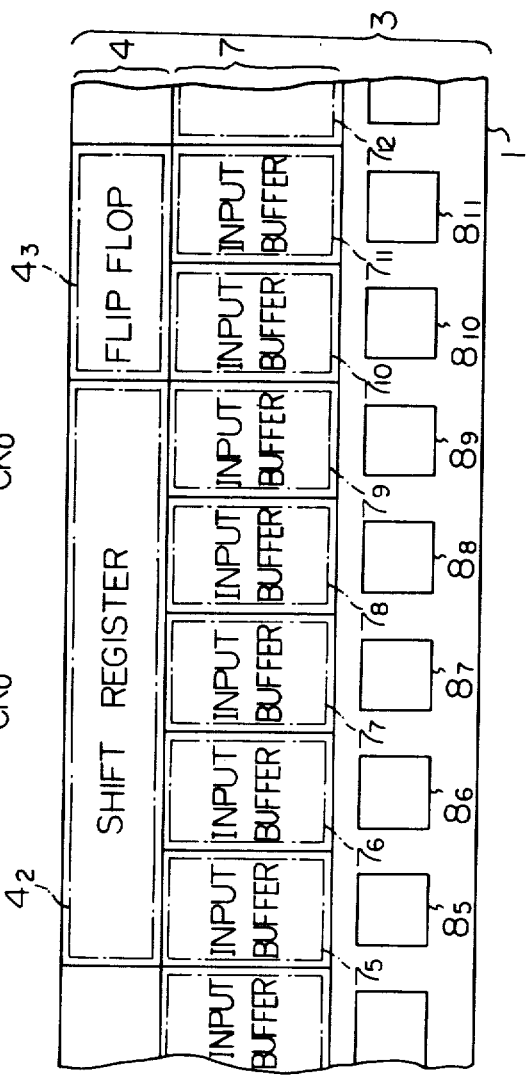
FIG. 11 is a block circuit diagram of another circuit of a part of the peripheral circuit region and the general purpose cell array region in FIG. 3.

FIG. 11 is a block circuit diagram of another example of part of the circuit on the peripheral circuit region 3 and the general purpose cell array region 4 illustrated in FIG. 3. In FIG. 11, all of the peripheral circuits $7_5$ through $7_{12}$, corresponding to the input/output pads $8_5$ through $8_{12}$, respectively, are input buffer circuits. The transistors in a general purpose cell array region $4_2$ corresponding to all of the input buffer circuits $7_5$ through $7_9$ comprise a shift register. The transistors in a general purpose cell array region $4_3$ corresponding to the input buffer circuits $7_{10}$ and $7_{11}$ comprise a flip-flop.

In the general purpose cell array region 4, not only the above-mentioned shift register or flip-flop, but any other circuit can be constructed in accordance with a users need.

Figure 12:
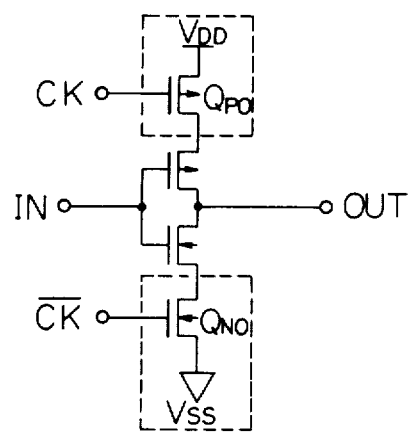
FIG. 12 is a circuit diagram of a clock gate which can be formed in the general purpose cell array region.

FIG. 12 is a circuit diagram of a clock gate which can be formed on the general purpose cell array region 4. In FIG. 12, between the power supply line $V_{DD}$ and the ground line $V_{SS}$, a P channel MOS transistor $Q_{P0}$ having a gate adapted to receive a clock signal CK and an N channel MOS transistor $Q_{N0}$ having a gate adapted to receive an inverted clock signal OVS/CK are connected in series so as to form a clock gate.

Conventionally, when a clock gate, as illustrated in FIG. 12, is to be constructed in the LSI, the basic cells in the internal cell array region must be used. As described before, each basic cell comprises an N channel MOS transistor and a P channel MOS transistor having a common gate. Accordingly, in order to provide one P channel MOS transistor $Q_{P0}$ and one N channel MOS transistor $Q_{N0}$ for one clock gate, two P channel MOS transistors and two N channel MOS transistors in the basic cells are unused in practice, resulting in wasted unused transistors, i.e., an unused P channel MOS transistor and unused N channel MOS transistor.

According to the present invention, since the gates of the P channel MOS transistors and the gates of the N channel MOS transistors in the general purpose cell array region 4 are separated, only one P channel MOS transistor, one N channel MOS transistor, and one CMOS inverter are necessary for constructing the above-mentioned clock gate, resulting in effective utilization of the general purpose cell array region.

Further, since the gates of the P channel MOS transistors and N channel MOS transistors on the general purpose cell array region are separated, a circuit in which P channel transistors and N channel transistors have different gate widths W, such as a Schmitt trigger circuit, can be easily constructed by making different gate widths. This technique of different gate widths is well known, e.g., for adjusting the threshold level of the CMOS logic circuits to the threshold level of a transistor-transistor logic circuit (TTL).

Above, a description was given of an example in which one P channel transistor array and one N channel transistor array were arranged on the general purpose cell array region 4. However, the essence of the present invention is not changed even when two rows or more N channel transistor arrays or P channel transistor arrays are arranged on the general purpose cell array region.

As described above, according to the present invention, a CMOS gate-array LSI, can be provided with a general purpose cell array region adjacent to the peripheral circuit region so as to construct a test circuit, which can test all of the circuits in the internal cell array region, without sacrifice to the internal cell array region. In accordance with requirements of an LSI designer, a Schmitt trigger circuit, clock gate circuit, and so forth can effectively be constructed in the general purpose cell array region. As a result, the manufacturing yield and functions of an LSI are improved.

We claim:

1. A master slice type semiconductor device including an output buffer and an input buffer, comprising:
    a master chip having a basic cell array region and an input/output cell array region surrounding the basic cell array region;
    a plurality of basic cells, arranged in said basic cell array region, each basic cell having the same structure and including transistors for forming a main circuit;
    a plurality of input/output cells, arranged in the input/output cell array region, for forming an interface circuit for said main circuit, each said input/output cell including first transistors for forming a part of the output buffer and second transistors for forming the input buffer; and
    a transistor array, arranged between said basic cell array region and said input/output cell array region, including a plurality of transistors having an arrangement different from the arrangement of said transistors in said basic cells, the output buffer circuit being formed by said transistors of said input/output cells and said transistors of said transistor array.

2. A master slice type semiconductor device as set forth in claim 1, wherein at least a part of said plurality of transistors in said transistor array is used for constructing desired logic circuits regardless of whether or not said output buffer circuit is constructed.

3. A master slice type semiconductor device as set forth in claim 2, wherein said plurality of transistors comprise:
    at least one N channel MOS transistor array formed on said transistor array; and
    at least one P channel MOS transistor array formed on said transistor array and extending parallel to said at least one N channel MOS transistor array.

4. A master slice type semiconductor device as set forth in claim 3, further comprising a power supply line and a ground line extending onto said input/output cell region.

5. A master slice type semiconductor device as set forth in claim 1, wherein said first transistors comprise:
    an N channel MOS output transistor formed on the periphery of said basic cell array region; and
    a P channel MOS output transistor formed on the periphery of said basic cell array region, each of said N channel and P channel MOS output transistors having a larger size than that of said plurality of transistors in said transistor array.

6. A master slice type semiconductor device as set forth in claim 5, wherein said second transistors comprise N channel MOS transistors and P channel MOS transistors.

7. A master slice type semiconductor as set forth in claim 1, wherein said input/output cell array region further comprises:
    input/output pad regions, formed adjacent to said input/output cells, having input/output pads arranged thereon; and
    a protective circuit region, formed adjacent to said transistor array, for constructing a protective circuit for said input buffer circuit.

8. A master slice type semiconductor device as set forth in claim 1, wherein said first transistors, said second transistors, and said transistors in said transistor array are provided for constructing a bi-directional buffer circuit including said input buffer circuit and said output buffer circuit.

9. A master slice type semiconductor device as set forth in claim 1, wherein said transistors in said transistor array form desired logic circuits when said output buffer circuit is not constructed.

10. A master slice type semiconductor device as set forth in claim 9, wherein at least one of said desired logic circuits is a Schmitt trigger circuit.

11. A master slice type semiconductor device as set forth in claim 10, wherein at least one of said desired logic circuits is a clock gate circuit.

12. A master slice type semiconductor device as set forth in claim 10, wherein at least one of said desired logic circuits is a shift register for testing the circuit formed by said basic cells.

13. A master slice type semiconductor device as set forth in claim 10, wherein at least one of said desired logic circuits is a flip-flop.

* * * * *